(12) United States Patent
Chen et al.

(10) Patent No.: US 11,171,634 B2
(45) Date of Patent: Nov. 9, 2021

(54) BUFFER CIRCUIT BETWEEN DIFFERENT VOLTAGE DOMAINS

(71) Applicant: TAIWAN SEMICONDUCTOR MANUFACTURING CO., LTD., Hsinchu (TW)

(72) Inventors: Chia-Hui Chen, Hsinchu (TW); Wan-Yen Lin, Kaohsiung (TW); Chia-Jung Chang, Hsinchu (TW)

(73) Assignee: TAIWAN SEMICONDUCTOR MANUFACTURING CO. LTD., Hsinchu (TW)

(*) Notice: Subject to any disclaimer, the term of this patent is extended or adjusted under 35 U.S.C. 154(b) by 0 days.

(21) Appl. No.: 16/875,849

(22) Filed: May 15, 2020

(65) Prior Publication Data

US 2021/0013873 A1 Jan. 14, 2021

Related U.S. Application Data

(60) Provisional application No. 62/871,587, filed on Jul. 8, 2019.

(51) Int. Cl.
| | |
|---|---|
| *H03K 19/185* | (2006.01) |
| *H03K 3/037* | (2006.01) |
| *H03K 19/0185* | (2006.01) |

(52) U.S. Cl.
CPC ... *H03K 3/0377* (2013.01); *H03K 19/018521* (2013.01)

(58) Field of Classification Search
CPC .............. H03K 3/0377; H03K 19/018521
See application file for complete search history.

(56) References Cited

U.S. PATENT DOCUMENTS

| | | | |
|---|---|---|---|
| 5,808,480 A * | 9/1998 | Morris ........... | H03K 19/018521 326/81 |
| 6,166,969 A | 12/2000 | Song et al. | |
| 7,154,309 B1 | 12/2006 | Talbot et al. | |
| 7,190,191 B1 | 3/2007 | Mathur et al. | |
| 7,295,038 B2 * | 11/2007 | Seo .................... | H03K 19/0016 326/68 |
| 7,705,630 B1 * | 4/2010 | Huang ........... | H03K 19/018521 326/63 |

(Continued)

FOREIGN PATENT DOCUMENTS

| | | |
|---|---|---|
| JP | 108307239 A | 11/1996 |
| KR | 20160043207 A | 4/2016 |

(Continued)

*Primary Examiner* — Dinh T Le
(74) *Attorney, Agent, or Firm* — Maschoff Brennan

(57) ABSTRACT

A circuit includes a first inverter and a second inverter. The first inverter is coupled to an input terminal. The input terminal receives an input signal varying in a first voltage domain. The second inverter is coupled between the first inverter and an output terminal. The second inverter generates an output signal varying in a second voltage domain. The first inverter includes a first PMOS transistor and a first NMOS transistor. The first PMOS transistor is biased by a first input tracking signal generated from the input signal. The first input tracking signal varies in a third voltage domain. The first NMOS transistor is biased by a second input tracking signal generated from the input signal. The second input tracking signal varies in the second voltage domain.

20 Claims, 11 Drawing Sheets

(56) References Cited

U.S. PATENT DOCUMENTS

| | | | |
|---|---|---|---|
| 8,093,938 B2* | 1/2012 | Duby | H03K 19/00315 |
| | | | 327/333 |
| 9,496,874 B2* | 11/2016 | Kim | H03K 19/018521 |
| 10,686,444 B1* | 6/2020 | Chen | H03K 19/00315 |
| 2010/0061165 A1* | 3/2010 | Cook | G11C 7/1057 |
| | | | 365/193 |
| 2016/0105183 A1 | 4/2016 | Kim | |

FOREIGN PATENT DOCUMENTS

| | | |
|---|---|---|
| TW | 513857 B | 12/2002 |
| TW | I647914 B | 1/2019 |

* cited by examiner

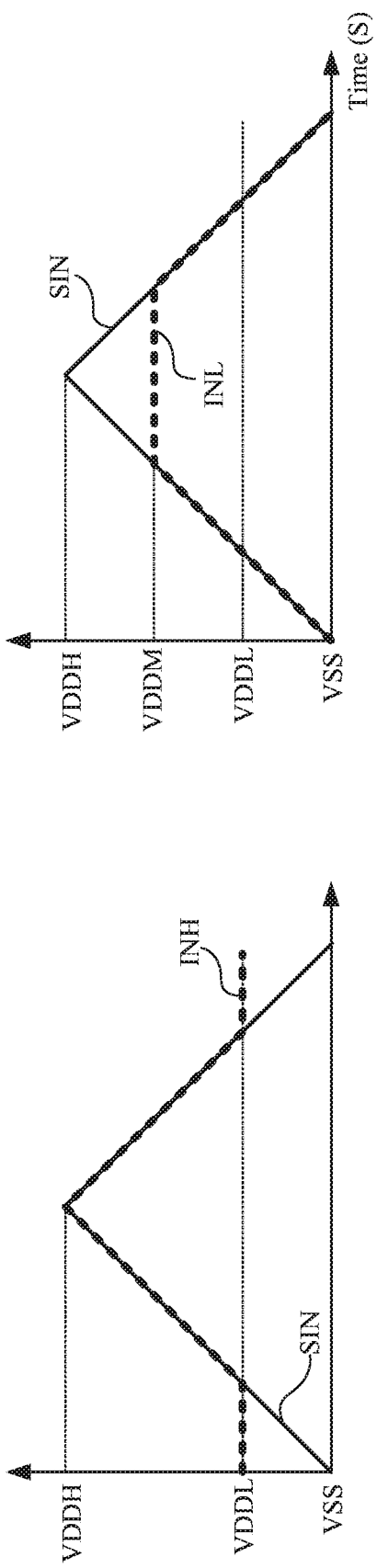
FIG. 4A
FIG. 4B
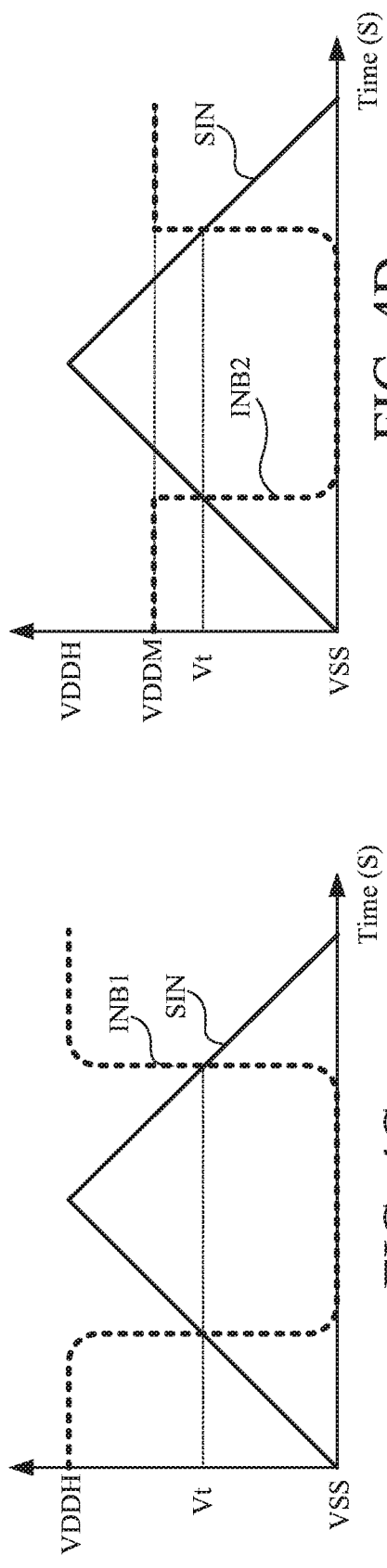
FIG. 4C
FIG. 4D

BUFFER CIRCUIT BETWEEN DIFFERENT VOLTAGE DOMAINS

CROSS-REFERENCE TO RELATED APPLICATION

This application claims priority to U.S. provisional Application Ser. No. 62/871,587, filed on Jul. 8, 2019, which is herein incorporated by reference.

BACKGROUND

With the advent of sub-micron technology, device dimensions of core components in an IC chip are getting ever smaller to gain on speed and cost. At the same time, operating voltages of the core components have also to be scaled down to accommodate the shrinking dimensions, such as thinner oxides and narrower spaces. However, on a board level, signals travel to and from the core components on interfaces still in traditional high voltages for interoperability with other chips and for maintaining signal integrity. For instance, core components in the IC chip may have an internal operating voltage of 1.0 V, yet it may interface with other devices on a 2.5V level. For such an IC chip, its input buffer must transform an external signal with a larger voltage swing range into an internal signal with a narrower voltage swing range.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a signal waveform illustrating a relationship between the input signal and the first input tracking signal in accordance with various embodiments of the present disclosure.

FIG. 4B is a signal waveform illustrating a relationship between the input signal and the second input tracking signal in accordance with various embodiments of the present disclosure.

FIG. 4C is a signal waveform illustrating a relationship between the input signal SIN and the first inverted signal in accordance with various embodiments of the present disclosure.

FIG. 4D is a signal waveform illustrating a relationship between the input signal and the second inverted signal in accordance with various embodiments of the present disclosure.

DETAILED DESCRIPTION

Figure 1:
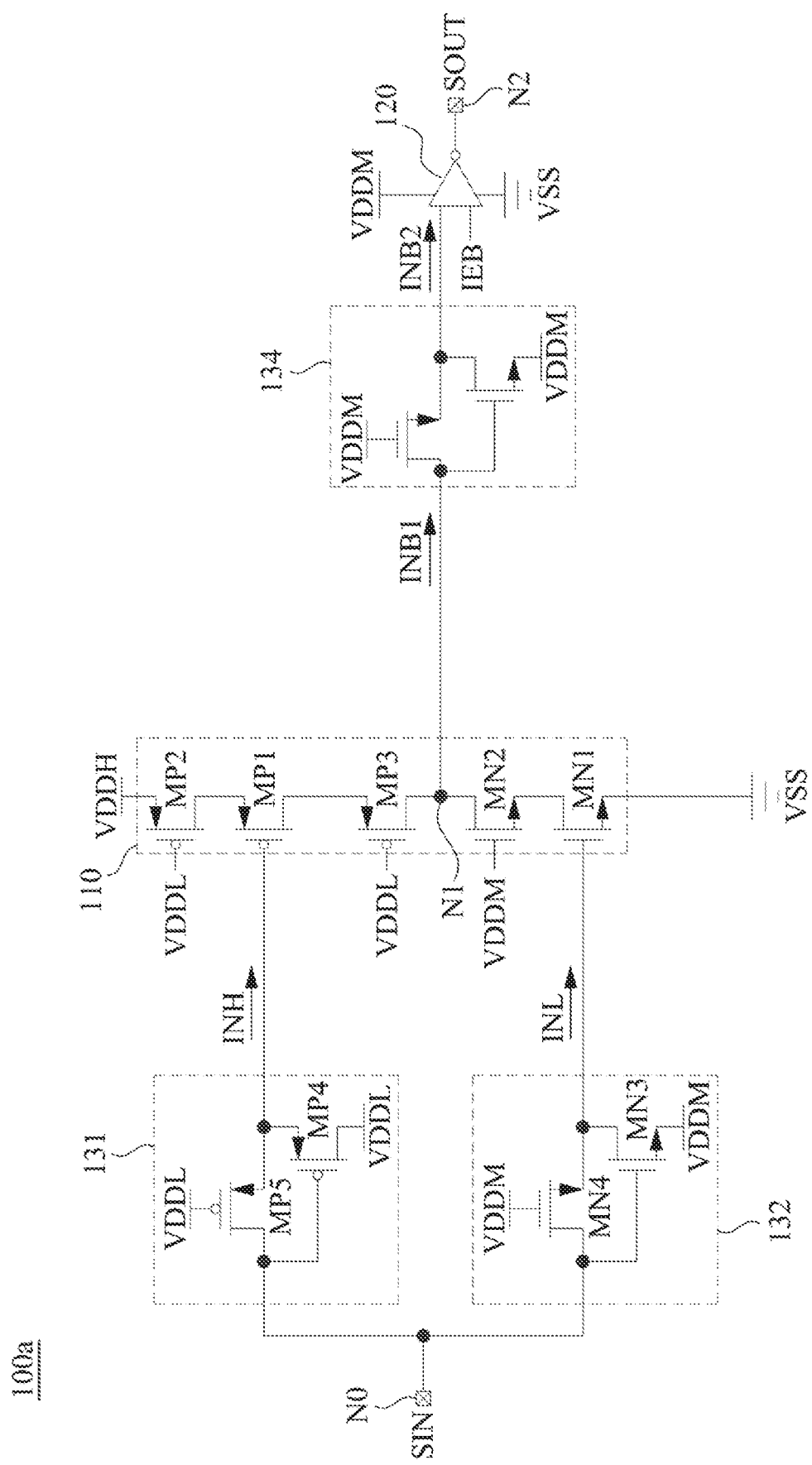
FIG. 1 is a schematic diagram illustrating an input buffer circuit in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

FIG. 1 is a schematic diagram illustrating an input buffer circuit 100a in accordance with various embodiments of the present disclosure. In some embodiments, the input buffer circuit 100a is coupled between an input terminal N0 and an output terminal N2. Based on an input signal SIN at the input terminal N0, the input buffer circuit 100a is configured to generate an output signal SOUT at the output terminal N2.

Figure 2:
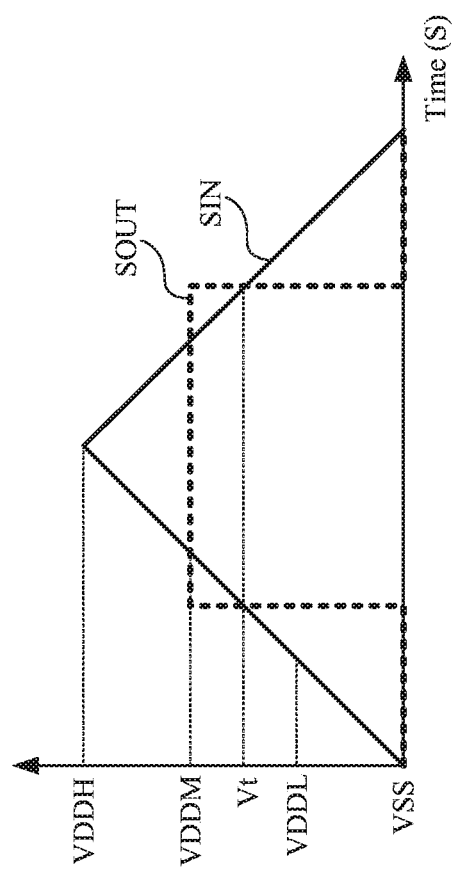
FIG. 2 is a signal waveform illustrating the input signal into the input buffer circuit and the output signal generated by the input buffer circuit in FIG. 1 in accordance with various embodiments of the present disclosure.

Reference is further made to FIG. 2. FIG. 2 is a signal waveform illustrating the input signal SIN into the input buffer circuit 100a and the output signal SOUT generated by the input buffer circuit 100a in FIG. 1 in accordance with various embodiments of the present disclosure. With respect to the embodiments of FIG. 1, like elements in FIG. 2 are designated with the same reference numbers for ease of understanding.

FIG. 2 shows a simulation result of the output signal SOUT in response to that the voltage level of the input signal SIN is raised from a negative supply level VSS to a first positive supply level VDDH and, then reduced from the first positive supply level VDDH back to the negative supply level VSS. As illustratively shown in FIG. 2, when the input signal SIN is higher than a threshold voltage Vt, the output signal SOUT generated by the input buffer circuit 100a is at logic "1" or high-level; when the input signal SIN is lower than the threshold voltage Vt, the output signal SOUT generated by the input buffer circuit 100a is also at logic "0" or low-level. In other words, the output signal SOUT has the same logic as the input signal SIN.

As illustratively shown in FIG. 1 and FIG. 2, the input signal SIN and the output signal SOUT are operated in different voltage domains. In some embodiments, the input signal SIN is a signal from an external circuit or an interface circuit (not shown in figures) on an I/C chip, and the input signal SIN varies in a first voltage domain with a larger voltage difference window, from a negative supply level VSS to a first positive supply level VDDH. For example, the input signal SIN varies from about 0V to about 1.8V. In some embodiments, the output signal SOUT is a signal transmitted toward core components (not shown in figures) in a I/C chip, the output signal SOUT varies in a second voltage domain with a narrower voltage difference window, from the negative supply level VSS to the second positive supply level VDDM lower than the first positive supply level VDDH. For example, the output signal SOUT varies from about 0V to about 1.2V.

In some embodiments, the core components are implemented in smaller dimensions, such as thinner oxides and narrower spaces, such that the core components are vulnerable to over-driving voltage and required to be operated at the voltage domain within the narrower voltage difference window. In some embodiments, the input buffer circuit 100a is configured to convert the input signal SIN varying in the first voltage domain into the output signal SOUT varying in the second voltage domain, so as to protect the core components driven by the output signal SOUT.

As illustratively shown in FIG. 1, the input buffer circuit 100a includes a first inverter 110, a second inverter 120, a tracking high circuit 131, a tracking low circuit 132 and another tracking low circuit 134. In some embodiments, the first inverter 110 is configured to generate a first inverted signal INB1 in response to the input signal SIN, and the second inverter 120 is configured to generate the output signal SOUT in response to the first inverted signal INB1.

Figure 3B:
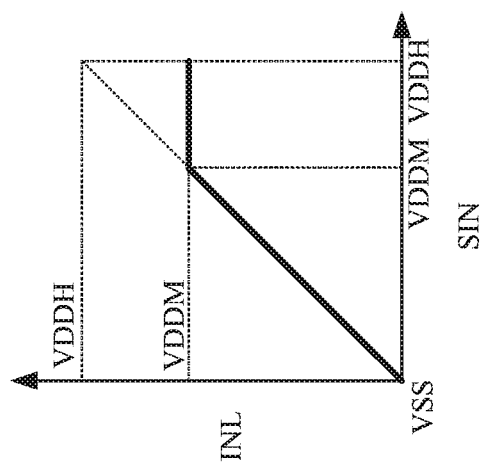
FIG. 3B is a signal relationship diagram illustrating a relationship between the input signal and the second input tracking signal in accordance with various embodiments of the present disclosure.
Figure 3A:
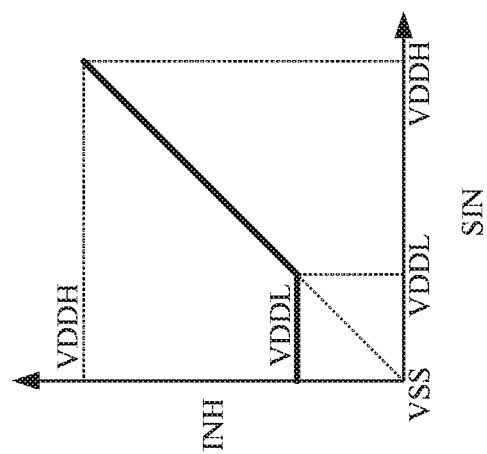
FIG. 3A is a signal relationship diagram illustrating a relationship between the input signal and the first input tracking signal in accordance with various embodiments of the present disclosure.

As illustratively shown in FIG. 1, the tracking high circuit 131 is configured to convert the input signal SIN into a first input tracking signal INH. Reference is further made to FIG. 3A, which is a signal relationship diagram illustrating a relationship between the input signal SIN and the first input tracking signal INH in accordance with various embodiments of the present disclosure. With respect to the embodiments of FIG. 1 and FIG. 2, like elements in FIG. 3A are designated with the same reference numbers for ease of understanding. As shown in FIG. 3A, when the input signal SIN is above a reference level VDDL, the tracking high circuit 131 duplicate the input signal SIN as the first input tracking signal INH. As shown in FIG. 3A, when the input signal SIN is lower than the reference level VDDL, the tracking high circuit 131 holds the first input tracking signal INH fixed at the reference level VDDL. In other words, in response to the input signal SIN varying in the first voltage domain (from VSS to VDDH), the tracking high circuit 131 generates the first input tracking signal INH varying in a third voltage domain (from VDDL to VDDH).

In some embodiments, the reference level VDDL is a voltage level between the negative supply level VSS to the second positive supply level VDDM. In some embodiments, the reference level VDDL can be configured at the first positive supply level VDDH minus the second positive supply level VDDM. For example, when the first positive supply level VDDH is about 1.8V and the second positive supply level VDDM is about 1.2V, the reference level VDDL can be configured at about 0.6V.

As illustratively shown in FIG. 1, the tracking low circuit 132 is configured to convert the input signal SIN into a second input tracking signal INL. Reference is further made to FIG. 3B, which is a signal relationship diagram illustrating a relationship between the input signal SIN and the second input tracking signal INL in accordance with various embodiments of the present disclosure. With respect to the embodiments of FIG. 3A, like elements in FIG. 3B are designated with the same reference numbers for ease of understanding. As shown in FIG. 3B, when the input signal SIN is below the second positive supply level VDDM, the tracking low circuit 132 duplicate the input signal SIN as the second input tracking signal INL. As shown in FIG. 3B, when the input signal SIN exceeds the second positive supply level VDDM, the tracking low circuit 132 holds the second input tracking signal INL fixed at the second positive supply level VDDM. In other words, in response to the input signal SIN varying in the first voltage domain (from VSS to VDDH), the tracking low circuit 132 generates the second input tracking signal INH varying in the second voltage domain (from VSS to VDDM).

As illustratively shown in FIG. 1, in some embodiments, the first inverter 110 includes five transistor connected in series between the first positive supply level VDDH and the negative supply level VSS. In embodiments shown in FIG. 1, there are three PMOS transistors MP1~MP3 and two NMOS transistors MN1~MN2 in the first inverter 110.

As illustratively shown in FIG. 1, in some embodiments, a source terminal of the PMOS transistor MP2 is coupled to the first positive supply level VDDH. A gate terminal of the PMOS transistor MP2 is biased by the reference level VDDL. Since the reference level VDDL is lower than the first positive supply level VDDH, the PMOS transistor MP2 is normally turned on. A drain terminal of the PMOS transistor MP2 is coupled to a source terminal of the PMOS transistor MP1. A source terminal of the PMOS transistor MP1 is coupled to the drain terminal of the PMOS transistor MP2. A gate terminal of the PMOS transistor MP1 is biased by the first input tracking signal INH varying in the third voltage domain. A drain terminal of the PMOS transistor MP1 is coupled to a source terminal of the PMOS transistor MP3. A gate terminal of the PMOS transistor MP3 is biased by the reference level VDDL. A drain terminal of the PMOS transistor MP3 is coupled to the first node N1.

The PMOS transistors MP1~MP3 is configured to pull up a voltage level of the first inverted signal INB1 at the first node N1 (i.e., the output node of the first inverter 110) in response to a first input tracking signal INH.

Reference is further made to FIG. 4A to FIG. 4D. FIG. 4A is a signal waveform illustrating a relationship between the input signal SIN and the first input tracking signal INH in accordance with various embodiments of the present disclosure. FIG. 4B is a signal waveform illustrating a relationship between the input signal SIN and the second input tracking signal INL in accordance with various embodiments of the present disclosure. FIG. 4C is a signal waveform illustrating a relationship between the input signal SIN and the first inverted signal INB1 in accordance with various embodiments of the present disclosure. FIG. 4D is a signal waveform illustrating a relationship between the input signal SIN and the second inverted signal INB2 in accordance with various embodiments of the present disclosure. With respect to the embodiments of FIG. 1 and FIG. 2, like elements in FIG. 4A to FIG. 4D are designated with the same reference numbers for ease of understanding.

As shown in FIG. 4A and FIG. 4C, when the input signal SIN is lower than the threshold voltage Vt, correspondingly the first input tracking signal INH is lower than the threshold voltage Vt and turns on the PMOS transistor MP1. Accordingly, the PMOS transistor MP3 is also turned on (MP2 is also turned on), such that the first inverted signal INB1 is pulled high to the first positive supply level VDDH.

It is noticed that terminals of the PMOS transistors MP1~MP3 are operated in the third voltage domain (from VDDL to VDDH). A third voltage difference window (VDDH-VDDL) of the third voltage domain is smaller than the first voltage difference window (VDDH-VSS) of the first voltage domain. For example, when VDDH=1.8V, VDDL=0.6V, and VSS=0V, the third voltage difference window, 1.2V, is smaller than the first voltage difference window, 1.8V. In this case, since terminals of the PMOS transistors MP1~MP3 are operated in the third voltage domain, the PMOS transistors MP1~MP3 in the first inverter 110 can be implemented with smaller sized transistors with a relatively lower voltage tolerance (compared to transistors operated in the first voltage domain with a larger voltage difference window), and the smaller sized transistors MP1~MP3 can operates with lower leakage currents and lower power consumptions.

As illustratively shown in FIG. 1, a drain terminal of the NMOS transistor MN2 is coupled to the first node N1. A gate terminal of the NMOS transistor is biased by the second positive supply level VDDM. A source terminal of the NMOS transistor MN2 is coupled to a drain terminal of the NMOS transistor MN1. A gate terminal of the NMOS transistor MN1 is biased by a second input tracking signal INL generated by the tracking low circuit 132 from the input signal. A source terminal of the NMOS transistor MN1 is coupled to the negative supply level VSS.

The NMOS transistors MN1~MN2 is configured to pull low the voltage level of the first inverted signal INB1 at the first node N1 in response to a second input tracking signal INL.

As shown in FIG. 4A and FIG. 4C, when the input signal SIN is higher than the threshold voltage Vt, correspondingly the second input tracking signal INL is higher than the threshold voltage Vt and turns on the NMOS transistor MN1. Accordingly, the NMOS transistor MN2 is also turned on, such that the first inverted signal INB1 is pulled low to the negative supply level VSS.

It is noticed that terminals of the NMOS transistors MN1~MN2 are operated in the second voltage domain (from VSS to VDDM). A second voltage difference window (VDDM-VSS) of the second voltage domain is smaller than the first voltage difference window (VDDH-VSS) of the first voltage domain. For example, when VDDH=1.8V, VDDM=1.2V, and VSS=0V, the second voltage difference window, 1.2V, is smaller than the first voltage difference window, 1.8V. In some embodiments, the second voltage difference window (VDDM-VSS) can be substantially equal to the third voltage difference window (VDDH-VDDL) mentioned above. In this case, since terminals of the NMOS transistors MN1~MN2 are operated in the second voltage domain, the NMOS transistors MN1~MN2 in the first inverter 110 can be implemented with smaller sized transistors with a relatively lower voltage tolerance (compared to transistors operated in the first voltage domain with a larger voltage difference window), and the smaller sized transistors MN1~MN2 can operates with lower leakage currents and lower power consumptions.

In some examples, if the pull-up transistors (e.g., MP1~MP3) and the pull-low transistors (e.g., MN1~MN2) are driven by the same input tracking signal, such as the second input tracking signal INL varying in the second voltage domain (from VSS to VDDM), biasing voltages to the pull-up transistors (e.g., MP1~MP3) and the pull-low transistors (e.g., MN1~MN2) will be shifted to a lower voltage range (from VSS to VDDM) compared to the full voltage range (from VSS to VDDH). It is not ideal to have these biasing voltages shifted to the lower voltage range, because it is desired that the threshold voltage Vt of the input buffer circuit 100a can be around a middle level between VSS to VDDH of the input signal SIN. To compensate the biasing voltages shifting to the lower voltage range and to keep the threshold voltage Vt, the sizes of the pull-up transistors (e.g., MP1~MP3) are required to be bigger than the pull-low transistors (e.g., MN1~MN2), so as to allow the pull-up transistors (e.g., MP1~MP3) to be operated in a wider voltage difference window from VSS to VDDH. In some examples, a ratio between a size of the pull-up transistor (MP1~MP3) and a size of the pull-low transistor (e.g., MN1~MN2) may reach 50:1 to 100:1. It is difficult to implement the PMOS transistors and NMOS transistors on a circuit layout with such a large size difference. In other words, the first inverter can have a reasonable size ratio between PMOS transistors and NMOS transistors.

As illustratively shown in FIG. 1, since the pull-up transistors (e.g., MP1~MP3) and the pull-low transistors (e.g., MN1~MN2) are driven by the different input tracking signals INH and INL. The first input tracking signal INH to the pull-up transistors (e.g., MP1~MP3) and the second input tracking signal INL to the pull-low transistors (e.g., MN1~MN2) will cover the full voltage range (from VSS to VDDH) of the input signal SIN. In some embodiments, the input buffer circuit 100a in FIG. 1 is not required to compensate the biasing voltages shifting, such that the sizes of the pull-up transistors (e.g., MP1~MP3) can be similar to the pull-low transistors (e.g., MN1~MN2). In some embodiments, a ratio between a size of the pull-up transistor (MP1~MP3) and a size of the pull-low transistor (e.g., MN1~MN2) can be about 1:1, 2:1 or 3:2. It is easier to implement the PMOS transistors and NMOS transistors on a circuit layout with similar sizes.

It is noticed that aforesaid voltage values of the input signal SIN (from about 0V to about 1.8V) and the output signal SOUT (from about 0V to about 1.2V) are given for demonstrations. The disclosure is not limited thereto. In some embodiments, the second positive supply level VDDM can be equal to or higher than a half of the first positive supply level VDDH. For example, when the first positive supply level VDDH is set at 3.6V, the second positive supply level VDDM can be equal to or higher than 1.8V. If the second positive supply level VDDM is lower than a half of the first positive supply level VDDH, the first input tracking signal INH and the second input tracking signal INL will not be able to cover the full voltage range (from VSS to VDDH) of the input signal SIN.

As shown in FIG. 1 and FIG. 4C, the first inverted signal INB1 at the first node N1 can be pulled up to the first positive supply level VDDH by MP1~MP3 or pulled low to the negative supply level VSS by MN1~MN2, such that the first inverted signal INB1 varying in the first voltage domain.

As shown in FIG. 1, FIG. 4C and FIG. 4D, the first inverted signal INB1 is converted by the tracking low circuit 134 into the second inverted signal INB2 varying in the second voltage domain. The behavior of the tracking low circuit 134 is similar to the aforementioned tracking low circuit 132, and the relationship between the first inverted signal INB1 and the second inverted signal INB2 is similar to the relationship between the input signal SIN and the second input tracking signal INL shown in FIG. 3B. As shown in FIG. 4C and FIG. 4D, when the first inverted signal INB1 is below the second positive supply level VDDM, the tracking low circuit 134 duplicates the first inverted signal INB1 as the second inverted signal INB2. As shown in FIG. 4C and FIG. 4D, when the first inverted signal INB1 exceeds the second positive supply level VDDM, the tracking low circuit 134 holds the second inverted signal INB2 fixed at the second positive supply level VDDM. In other words, according to the first inverted signal INB1 varying in the first voltage domain (from VSS to VDDH), the tracking low circuit 134 generates the second inverted signal INB2 varying in the second voltage domain (from VSS to VDDM).

As shown in FIG. 1, FIG. 2 and FIG. 4D, the second inverter 120 is configured to invert the second inverted signal INB2 in the second voltage domain into the output signal SOUT (as shown in FIG. 2) also in the second voltage domain. In some embodiments, the second inverter 120 is configured to invert signals in the same voltage domain, such that the second inverter 120 can be implemented with a CMOS inverter.

In embodiments shown in FIG. 1, the tracking high circuit 131 includes two PMOS transistors MP4 and MP5. A source terminal of the PMOS transistor MP4 is coupled to the gate terminal of the PMOS transistor MP1. A gate terminal of the PMOS transistor MP4 is coupled to the input terminal N0. A drain terminal of the PMOS transistor MP4 is coupled to the reference level VDDL. A source terminal of the PMOS transistor MP5 is coupled to the gate terminal of the PMOS transistor MP1. A gate terminal of the PMOS transistor MP5 is coupled to the reference level VDDL. A drain terminal of the PMOS transistor MP5 is coupled to the input terminal N0. When the input signal SIN is high, the PMOS transistor MP4 is turned off and the PMOS transistor MP5 is turned on, so as to duplicate the input signal SIN as the first input tracking signal INH. When the input signal SIN is low, the PMOS transistor MP4 is turned on, the PMOS transistor MP4 pulls low the first input tracking signal INH to the reference level VDDL.

In embodiments shown in FIG. 1, the tracking low circuit 132 includes two NMOS transistors MN3 and MN4. A source terminal of the NMOS transistor MN3 is coupled to the second positive supply level VDDM. A gate terminal of the NMOS transistor MN3 is coupled to the input terminal N0. A drain terminal of the NMOS transistor MN3 is coupled to the gate terminal of the NMOS transistor MN1. A source terminal of the NMOS transistor MN4 is coupled to the gate terminal of the NMOS transistor MN1. A gate terminal of the NMOS transistor MN4 is coupled to the second positive supply level VDDM. A drain terminal of the NMOS transistor MN4 is coupled to the input terminal N0. When the input signal SIN is low, the NMOS transistor MP3 is turned off and the NMOS transistor MP4 is turned on, so as to duplicate the input signal SIN as the second input tracking signal INL. When the input signal SIN is high, the NMOS transistor MP3 is turned on, the NMOS transistor MP3 holds the second input tracking signal INL fixed at the second positive supply level VDDM. In some embodiments, the structure of tracking low circuit 134 is similar to the structure of the tracking low circuit 132.

Figures 5A, 5B:
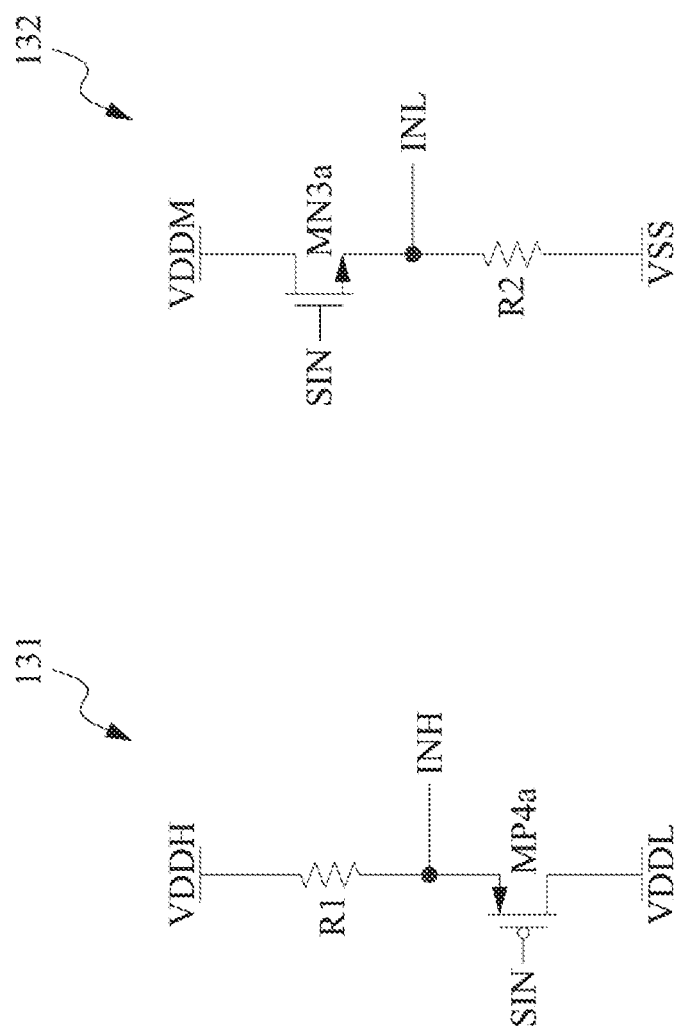
FIG. 5A is a schematic diagram illustrating another structure of the tracking high circuit in FIG. 1.
FIG. 5B is a schematic diagram illustrating another structure of the tracking high circuit in FIG. 1.

It is noticed that the tracking high circuit 131, the tracking low circuits 132 and 134 are not limited to the structures shown in FIG. 1. Reference is further made to FIG. 5A and FIG. 5B. FIG. 5A is a schematic diagram illustrating another structure of the tracking high circuit 131 in FIG. 1. FIG. 5B is a schematic diagram illustrating another structure of the tracking low circuit 132 in FIG. 1. With respect to the embodiments of FIG. 1, like elements in FIG. 5A to FIG. 5B are designated with the same reference numbers for ease of understanding.

In the embodiments shown in FIG. 5A, the tracking high circuit 131 includes a PMOS transistor MP4a and a resistor R1. A source terminal of the PMOS transistor MP4a is coupled to the gate terminal of the PMOS transistor MP1 (referring to FIG. 1) for outputting the first input tracking signal INH. A gate terminal of the PMOS transistor MP4a is coupled to the input terminal N0 (referring to FIG. 1) for receiving the input signal SIN. A drain terminal of the fourth PMOS transistor MP4a is coupled to the reference level VDDL. A first terminal of the resistor R1 is coupled to the first positive supply level VDDH. A second terminal of the resistor R1 is coupled to the gate terminal of the PMOS transistor MP1 (referring to FIG. 1) for outputting the first input tracking signal INH. The structure of the tracking high circuit 131 in FIG. 5A will generate the first input tracking signal INH in response to the input signal SIN similar to the relationship shown in FIG. 3A.

In the embodiments shown in FIG. 5B, the tracking low circuit 132 include a NMOS transistor MN3a and a resistor R2. A source terminal of the NMOS transistor MN3a is coupled to the gate terminal of the NMOS transistor MN1 (referring to FIG. 1) for outputting the second input tracking signal INL. A gate terminal of the NMOS transistor MN3a is coupled to the input terminal N0 (referring to FIG. 1) for receiving the input signal SIN. A drain terminal of the NMOS transistor MN3a is coupled to the second positive supply level VDDM. A first terminal of the resistor R2 is coupled to the gate terminal of the NMOS transistor MN1 (referring to FIG. 1) for outputting the second input tracking signal INL. A second terminal of the resistor R2 is coupled to the negative supply level VSS. The structure of the tracking low circuit 132 in FIG. 5B will generate the second input tracking signal INL in response to the input signal SIN similar to the relationship shown in FIG. 3A.

In other words, the tracking high circuit 131, the tracking low circuits 132 and 134 are not limited to the structures shown in FIG. 1. Any equivalent circuit capable of generating tracking signal corresponding to the input signal (referring to the corresponding relationships shown in FIG. 3A and FIG. 3B) can be utilized in the input buffer circuit 100a.

In some embodiments, the input buffer circuit 100a shown in FIG. 1 includes cascade-connected PMOS and NMOS transistors, and each of the PMOS and NMOS transistors is biased by gate signals in suitable voltage domains, such that the PMOS and NMOS transistors can be formed in small sizes with a smaller standby leakage power. In addition, the first inverter 110 in the input buffer circuit 100a can have a reasonable size ratio between PMOS transistors and NMOS transistors. As shown in FIG. 2, a duty cycle of the output signal SOUT generated by the input buffer circuit 100a in response to the input signal SIN is about 50%. Because the first inverter 110 is able detect the full voltage range of the input signal SIN, the duty cycle of the output signal SOUT generated by the input buffer circuit 100a can be closer to about 50% (e.g., about 40% to about 60%) under different process/voltage/temperature (PVT) conditions, compared to biasing the first inverter with a partial voltage range of the input signal SIN. In aforesaid embodiments, the input buffer circuit 100a changes the level of the output signal SOUT in response to the input signal SIN relative to the threshold voltage.

In some other embodiments, the input buffer circuit can include a Schmitt trigger function, which can have different threshold voltages, one of which for the input signal SIN from low to high, and another one for the input signal SIN from high to low.

Figure 6:
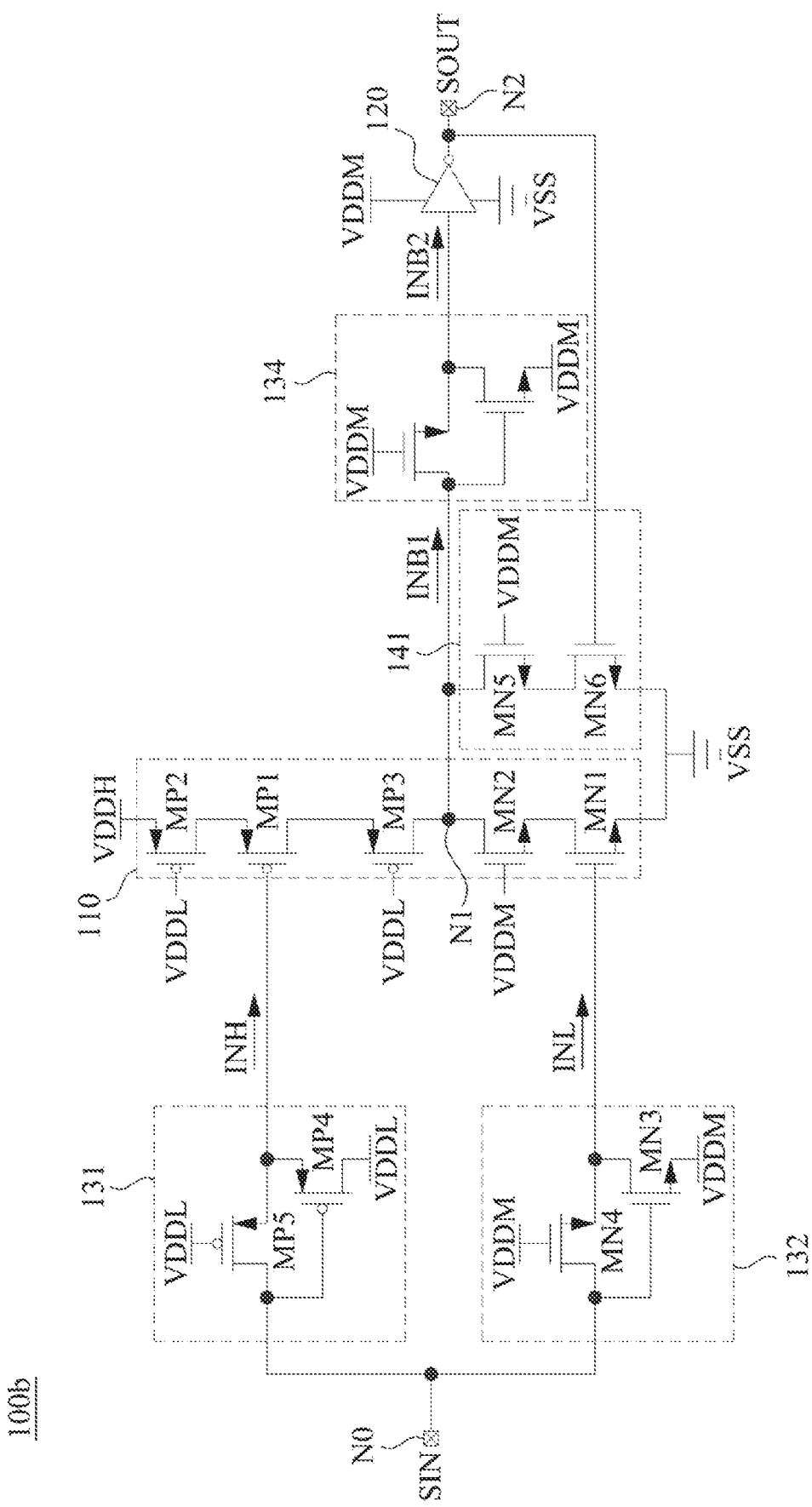
FIG. 6 is a schematic diagram illustrating an input buffer circuit in accordance with various embodiments of the present disclosure.

Reference is further made to FIG. 6. FIG. 6 is a schematic diagram illustrating an input buffer circuit 100b in accordance with various embodiments of the present disclosure. In some embodiments, the input buffer circuit 100b is coupled between an input terminal N0 and an output terminal N2. Based on an input signal SIN at the input terminal N0, the input buffer circuit 100b is configured to generate an output signal SOUT at the output terminal N2. With respect to the embodiments of FIG. 1 to FIG. 5B, like elements in FIG. 6 are designated with the same reference numbers for ease of understanding.

Compared to the input buffer circuit 100a in FIG. 1, the input buffer circuit 100b in FIG. 6 further includes a feedback loop 141 coupled between the output terminal N2 to the first node N1. The feedback loop 141 includes NMOS transistors MN5 and MN6. A drain terminal of the NMOS transistor MN5 is coupled to the first node N1. A gate terminal of the NMOS transistor MN5 is coupled to the second positive supply level VDDM. A drain terminal of the NMOS transistor MN6 is coupled to a source terminal of the NMOS transistor MN5. A gate terminal of the NMOS transistor MN6 is coupled to the output terminal N2. A source terminal of the NMOS transistor MN6 is coupled to the negative supply level VSS. In the embodiments shown in FIG. 6, the feedback loop 141 is another pull low path relative to the first node N1 in addition to the NMOS transistors MN1~MN2 in the first inverter 110.

Figure 7:
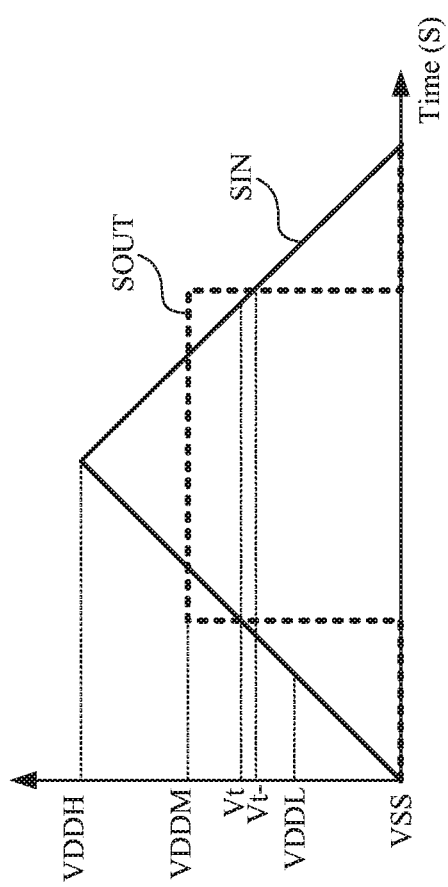
FIG. 7 is a signal waveform illustrating the input signal into the input buffer circuit and the output signal generated by the input buffer circuit in FIG. 6 in accordance with various embodiments of the present disclosure.

Reference is further made to FIG. 7. FIG. 7 is a signal waveform illustrating the input signal SIN into the input buffer circuit 100b and the output signal SOUT generated by the input buffer circuit 100b in FIG. 6 in accordance with various embodiments of the present disclosure. With respect to the embodiments of FIG. 6, like elements in FIG. 7 are designated with the same reference numbers for ease of understanding.

As shown in FIG. 6 and FIG. 7, during a transition of the input signal SIN from logic "1" to logic "0", e.g., from the first positive supply level VDDH to the negative supply level VSS, the input signal SIN is initially at the first positive supply level VDDH (logic "1"), the first inverted signal INB1 is initially at the negative supply level VSS (logic "0") and the output signal SOUT is initially at the second positive supply level VDDM (logic "1"). The NMOS transistors MN1~MN2 in the first inverter 110 is turned on to pull low the first inverted signal INB1 at the first node N1. In addition, the output signal SOUT is feedback to turn on the NMOS transistor MN6 in the feedback loop 141. Therefore, the NMOS transistors MN5 and MN6 are also turned on to pull low the voltage level on the first node N1.

During the transition of the input signal SIN gradually from the first positive supply level VDDH to the negative supply level VSS, because there are two pull low paths (MN1~MN2 and MN5~MN6) against one pull high path (MP1~MP3), the first inverted signal INB1 and the output signal SOUT will flip later than the original threshold voltage Vt. As shown in FIG. 7, the output signal SOUT flips from the second positive supply level VDDM to the negative supply level VSS, when the input signal SIN reaches a low threshold voltage Vt−. In this case, the input buffer circuit 100b has a Schmitt trigger function, which has one threshold voltage Vt related to the input signal SIN from logic "0" to logic "1", and another threshold voltage Vt− related to the input signal SIN from logic "1" to logic "0".

In other words, the feedback loop 141 in the input buffer circuit 100b is utilized to reduce the low threshold voltage Vt− of the input buffer circuit 100b when the input signal SIN varying from logic "1" to logic "0".

Figure 8:
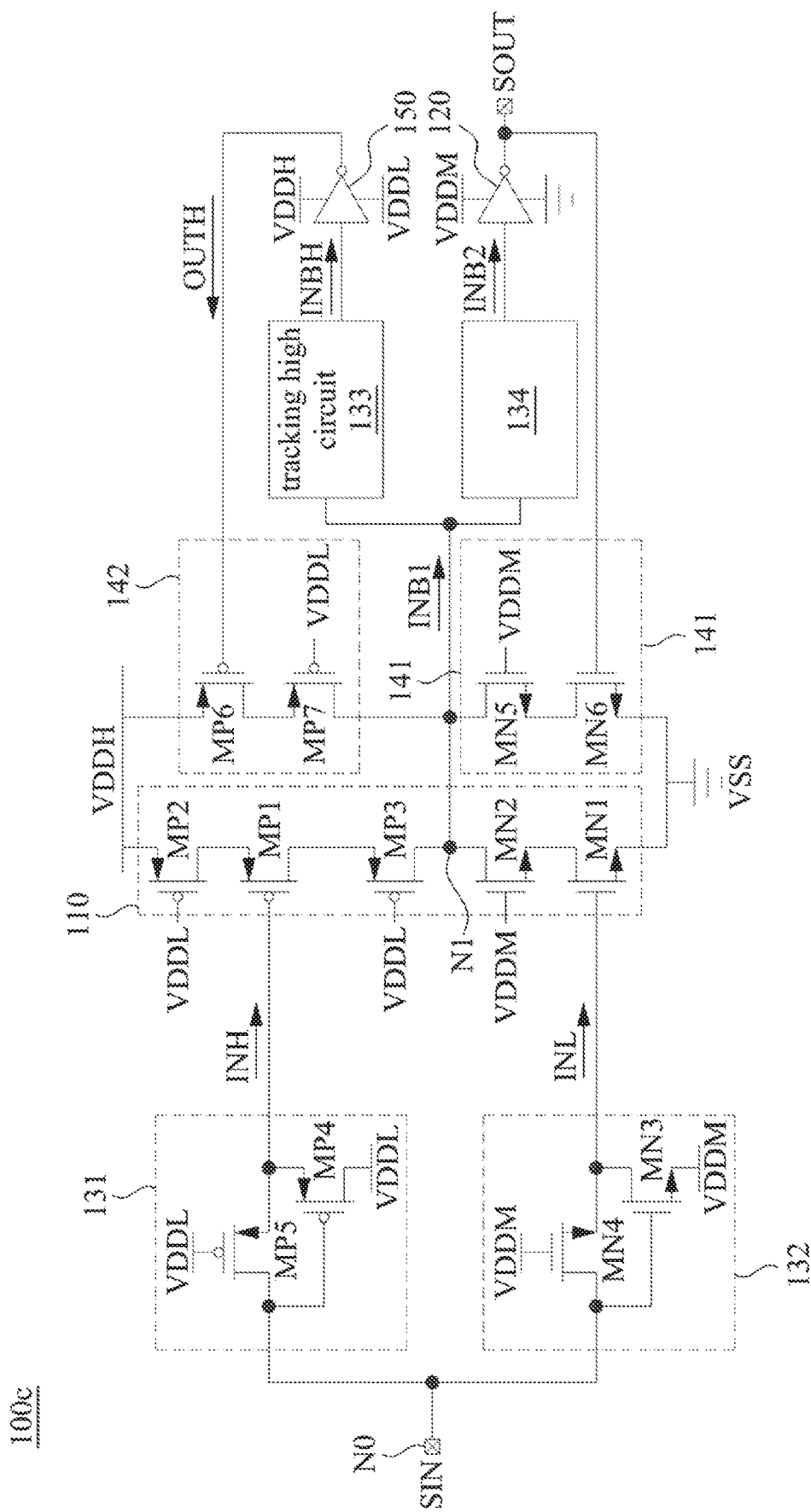
FIG. 8 is a schematic diagram illustrating an input buffer circuit in accordance with various embodiments of the present disclosure.

In some other embodiments, the input buffer circuit can include a Schmitt trigger function on both sides of threshold voltages, when the input signal SIN varying from logic "1" to logic "0" and also when the input signal SIN varying from logic "0" to logic "1". Reference is further made to FIG. 8. FIG. 8 is a schematic diagram illustrating an input buffer circuit 100c in accordance with various embodiments of the present disclosure. In some embodiments, the input buffer circuit 100c is coupled between an input terminal N0 and an output terminal N2. Based on an input signal SIN at the input terminal N0, the input buffer circuit 100c is configured to generate an output signal SOUT at the output terminal N2. With respect to the embodiments of FIG. 1 and FIG. 6, like elements in FIG. 8 are designated with the same reference numbers for ease of understanding.

Compared to the input buffer circuit 100b in FIG. 6, the input buffer circuit 100c in FIG. 8 further includes a tracking high circuit 133, a third inverter 150 and another feedback loop 142 (other than the feedback loop 141). In some embodiment, structures of the tracking high circuit 133 are similar to the tracking high circuit 131 discussed in FIG. 1 or FIG. 5A, and behaviors of the tracking high circuit 133 are similar to the tracking high circuit 131 discussed in FIG. 3A and FIG. 4A. Therefore, the structures and behaviors of the tracking high circuit 133 are not to be explained again. The tracking high circuit 133 is utilized to convert the first inverted signal INB1 varying in the first voltage domain into the third inverted signal INBH varying in the third voltage domain. The third inverted signal INBH is inverted by the third inverter 150 into a high output signal OUTH varying in the third voltage domain. The high output signal OUTH feedbacks to the feedback loop 142.

As shown in FIG. 8, the feedback loop 142 includes PMOS transistors MP6 and MP7. A source terminal of the PMOS transistor MP6 is coupled to the first positive supply level VDDH. A gate terminal of the PMOS transistor MP6 is coupled to the third inverter 150. A source terminal of the PMOS transistor MP7 is coupled to a drain terminal of the PMOS transistor MP6. A gate terminal of the PMOS transistor MP7 is coupled to the reference level VDDL. A drain terminal of the PMOS transistor MP7 is coupled to the first node N1.

In the embodiments shown in FIG. 8, the feedback loop 141 is another pull high path relative to the first node N1 in addition to the PMOS transistors MP1~MP3 in the first inverter 110.

Figure 9:
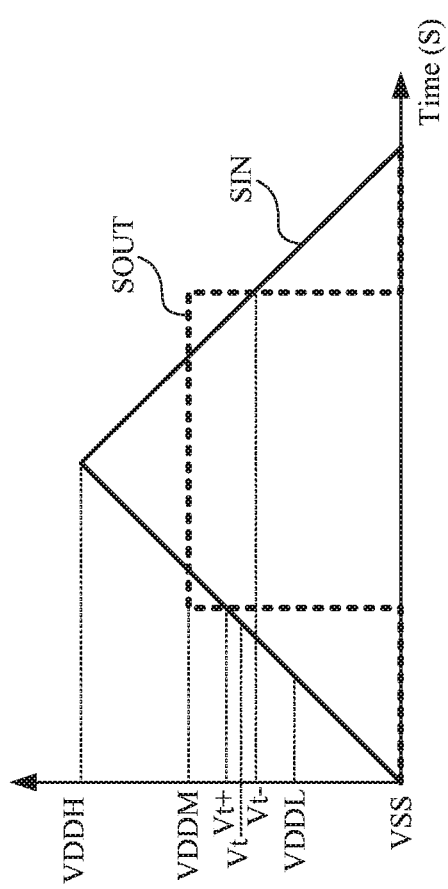
FIG. 9 is a signal waveform illustrating the input signal SIN into the input buffer circuit and the output signal generated by the input buffer circuit in FIG. 8 in accordance with various embodiments of the present disclosure.

Reference is further made to FIG. 9. FIG. 9 is a signal waveform illustrating the input signal SIN into the input buffer circuit 100c and the output signal SOUT generated by the input buffer circuit 100c in FIG. 8 in accordance with various embodiments of the present disclosure. With respect to the embodiments of FIG. 8, like elements in FIG. 9 are designated with the same reference numbers for ease of understanding.

As shown in FIG. 8 and FIG. 9, during a transition of the input signal SIN from logic "0" to logic "1", e.g., from the negative supply level VSS to the first positive supply level VDDH, the input signal SIN is initially at the negative supply level VSS (logic "0"), the first inverted signal INB1 is initially at the first positive supply level VDDH (logic "1") and the output signal SOUT is initially at the negative supply level VSS (logic "0"). The PMOS transistors MP1~MP3 in the first inverter 110 is turned on to pull high the first inverted signal INB1 at the first node N1. In addition, the high output signal OUTH is feedback to turn on the PMOS transistor MN6 in the feedback loop 142. Therefore, the PMOS transistors MN6 and MN7 are also turned on to pull high the voltage level on the first node N1.

During the transition of the input signal SIN gradually from the negative supply level VSS to the first positive supply level VDDH, because there are two pull low paths (MP1~MP3 and MP6~MP7), the first inverted signal INB1 and the output signal SOUT will flip later than the original threshold voltage Vt. As shown in FIG. 9, the output signal SOUT flips from the second positive supply level VDDM to the negative supply level VSS, when the input signal SIN reaches a high threshold voltage Vt+. In this case, the input buffer circuit 100c has a Schmitt trigger function, which has one high threshold voltage Vt+ related to the input signal SIN from logic "0" to logic "1", and one low threshold voltage Vt− related to the input signal SIN from logic "1" to logic "0". The high threshold voltage Vt+ is higher than the threshold voltage Vt, and the low threshold voltage Vt− is lower than the threshold voltage Vt.

In other words, the feedback loop 141 in the input buffer circuit 100b is utilized to reduce the low threshold voltage Vt− of the input buffer circuit 100b when the input signal SIN varying from logic "1" to logic "0". In other words, the input buffer circuit 100c has a Schmitt trigger function on both sides of threshold voltages, when the input signal SIN varying from logic "1" to logic "0" and also when the input signal SIN varying from logic "0" to logic "1".

Figure 10:
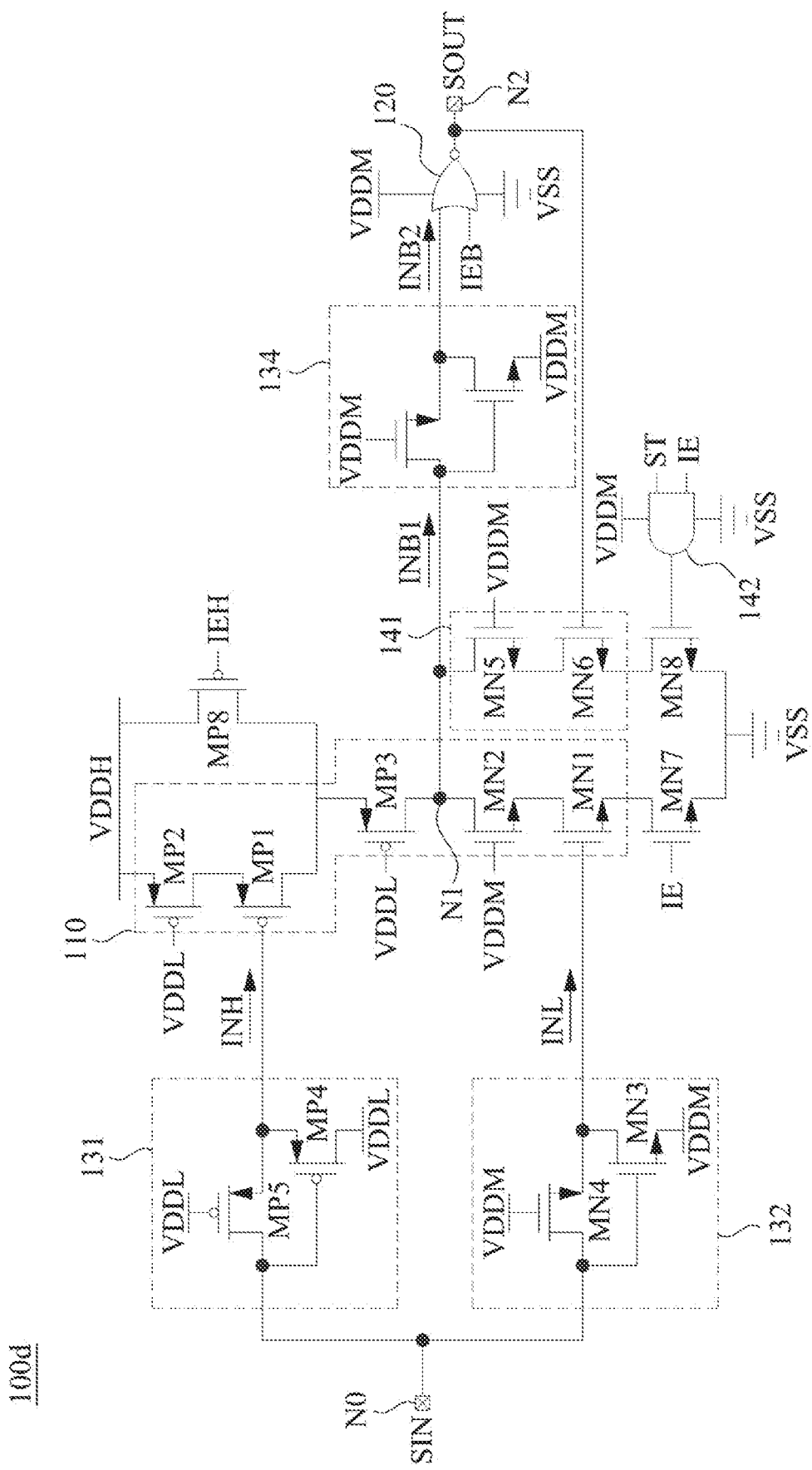
FIG. 10 is a schematic diagram illustrating an input buffer circuit in accordance with various embodiments of the present disclosure.

Reference is further made to FIG. 10. FIG. 10 is a schematic diagram illustrating an input buffer circuit 100d in accordance with various embodiments of the present disclosure. In some embodiments, the input buffer circuit 100d is coupled between an input terminal N0 and an output terminal N2. Based on an input signal SIN at the input terminal N0, the input buffer circuit 100d is configured to generate an output signal SOUT at the output terminal N2. With respect to the embodiments of FIG. 1 to FIG. 9, like elements in FIG. 10 are designated with the same reference numbers for ease of understanding.

In some embodiments, the input buffer circuit 100d in FIG. 10 further includes an input enable function controlled by an enable signal. When the enable signal is high or logic "1", the input buffer circuit 100d is activated to generate the output signal SOUT in response to the input signal SIN. On the other hand, when the enable signal is low or logic "0", input buffer circuit 100d is deactivated, and does not response to the input signal SIN.

Compared to the input buffer circuit 100b in FIG. 6, the input buffer circuit 100d in FIG. 10 further includes a PMOS transistor MP8, a NMOS transistor MN7, another NMOS transistor MN8 and an AND-logic gate 142. In addition, the second inverter 120 in the input buffer circuit 100d is implemented with a NOR-logic inverter. The second inverter 120 performs NOR-logic between the second inverted signal INB2 varying in the second voltage domain and an inverted enable signal IEB varying in the second voltage domain.

A source terminal of the PMOS transistor MP8 is coupled to the first positive supply level VDDH. A gate terminal of the PMOS transistor MP8 is coupled to a first enable signal IEH in the third voltage domain. A drain terminal of the PMOS transistor MP8 is coupled to the source terminal of the PMOS transistor MP3.

A source terminal of the NMOS transistor MN7 is coupled to the negative supply level VSS. A gate terminal of the NMOS transistor MN7 is coupled to a second enable signal IE varying in the second voltage domain. A drain terminal of the NMOS transistor MN7 is coupled to the source terminal of the NMOS transistor MN1.

A source terminal of the NMOS transistor MN8 is coupled to the negative supply level VSS. A gate terminal of the NMOS transistor MN8 is coupled to the AND-logic gate 142. A drain terminal of the NMOS transistor MN8 is coupled to the source terminal of the NMOS transistor MN6.

The AND-logic gate 142 is configured to perform AND-logic between the second enable signal IE varying in the second voltage domain and a Schmitt-trigger enable signal ST varying in the second voltage domain.

When the input enable function is on and the Schmitt-trigger function is on, the first enable signal IEH and the second enable signal IE are configured at logic "1"; the inverted enable signal IEB is configured at logic "0"; and, the Schmitt-trigger enable signal ST is at logic "1". The PMOS transistor MP8 is turned off. The NMOS transistors MN7 and MN8 are turned on. The input buffer circuit 100d activates with the Schmitt-trigger function.

When the input enable function is on and the Schmitt-trigger function is off, the first enable signal IEH and the second enable signal IE are configured at logic "1"; the inverted enable signal IEB is configured at logic "0"; and, the Schmitt-trigger enable signal ST is at logic "0". The PMOS transistor MP8 is turned off. The NMOS transistor MN7 is turned on and the NMOS transistor MN8 are turned off. The input buffer circuit 100d activates without the Schmitt-trigger function.

When the input enable function is off, the first enable signal IEH and the second enable signal IE are configured at logic "0"; the inverted enable signal IEB is configured at logic "1". The PMOS transistor MP8 is turned on. The NMOS transistor MN7 is turned off. The input buffer circuit 100d is deactivated.

In some embodiments, the second enable signal IE, the inverted enable signal IEB and Schmitt-trigger enable signal ST vary in the second voltage domain, and the first enable signal IEH varies in the third voltage domain, such that the transistors in the input buffer circuit 100d can be operated in suitable voltage variation windows.

In embodiments shown in FIG. 10, the input buffer circuit 100d demonstrates how to integrate the input enable function onto the input buffer circuit 100b shown in FIG. 6. In some other embodiments, the input enable function shown in the input buffer circuit 100d shown in FIG. 10 can also be integrated onto the input buffer circuit 100a shown in FIG. 1 or the input buffer circuit 100c shown in FIG. 8.

Figure 11:
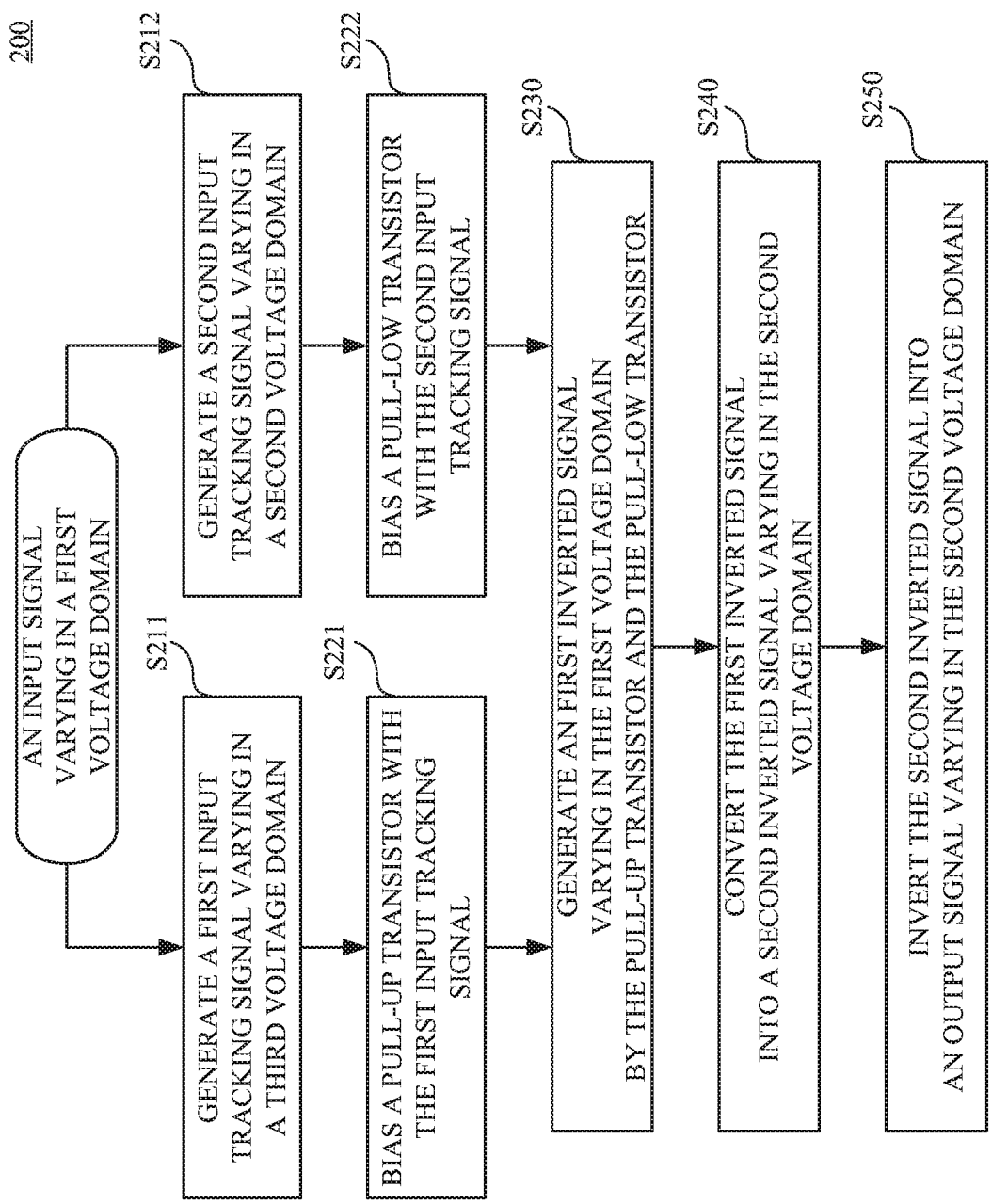
FIG. 11 is a flow chart diagram illustrating a method in accordance with various embodiments of the present disclosure.

FIG. 11 is a flow chart diagram illustrating a method 200 in accordance with various embodiments of the present disclosure. In some embodiments, the method 200 in FIG. 11 can be utilized on the input buffer circuits 100a-100d discussed in aforesaid embodiments shown in FIG. 1, FIG. 6, FIG. 8 and/or FIG. 10. With respect to the embodiments of FIG. 1 to FIG. 10, like elements in FIG. 11 are designated with the same reference numbers for ease of understanding. For brevity, the method 200 in the following paragraphs will be discussed along with the embodiments of the input buffer circuit 100a shown in FIG. 1 and related embodiments in FIG. 2 to FIG. 5B. It is noticed that the method 200 is also suitable to be utilized in other embodiments of the input buffer circuits 100b-100d shown in FIG. 6, FIG. 8 or FIG. 10.

In some embodiments, the method 200 in FIG. 11 is used to generate the output signal SOUT varying in the second voltage domain, such as from VSS to VDDM, according to the input signal SIN varying in the first voltage domain, such as from VSS to VDDH, with references to FIG. 2.

As illustratively shown in FIG. 1, FIG. 4A and FIG. 11, in response to the input signal SIN varying in the first voltage domain, e.g., VSS~VDDH, operation 5211 is performed, by the tracking high circuit 131, to generate the first input tracking signal INH varying in the third voltage domain, e.g., from VDDL to VDDH.

As illustratively shown in FIG. 1, FIG. 4B and FIG. 11, in response to the input signal SIN varying in the first voltage domain, e.g., VSS~VDDH, operation 5212 is performed, by the tracking low circuit 132, to generate the second input tracking signal INL varying in the second voltage domain, e.g., from VSS to VDDM.

In some embodiments, the first voltage domain has a larger voltage difference window, which is in a range from a negative supply level VSS to a first positive supply level VDDH. For example, the first voltage domain covers from about 0V to about 1.8V. In some embodiments, the second voltage domain has a narrower voltage difference window, which is in a range from the negative supply level VSS to the second positive supply level VDDM. For example, the second voltage domain covers from about 0V to about 1.2V. In some embodiments, the third voltage domain has another narrower voltage difference window, which is in a range from the reference level VDDL to the first positive supply level VDDH. For example, the third voltage domain covers from about 0.6V to about 1.8V. It is noticed that aforesaid voltage values are given for demonstrations.

As illustratively shown in FIG. 1 and FIG. 11, operation 5221 is performed to bias a pull-up transistor (e.g., the PMOS transistor MP1) with the first input tracking signal INH. As illustratively shown in FIG. 1 and FIG. 11, operation 5222 is performed to bias a pull-low transistor (e.g., the NMOS transistor MN1) with the second input tracking signal INL.

As illustratively shown in FIG. 1, FIG. 4C and FIG. 11, operation 5230 is performed to generate the first inverted signal INB1 varying in the first voltage domain by the pull-up transistor and the pull-low transistor in the first inverter 110.

As illustratively shown in FIG. 1, FIG. 4D and FIG. 11, operation 5240 is performed to convert the first inverted signal INB1, by the tracking low circuit 134, into the second inverted signal INB2 varying in the second voltage domain.

As illustratively shown in FIG. 1, FIG. 2, FIG. 4D and FIG. 11, operation 5250 is performed to invert the second inverted signal INB2, by the second inverter 120, into the output signal SOUT varying in the second voltage domain. In some embodiments, the output signal SOUT is a signal transmitted toward core components (not shown in figures) in an integrated circuit chip.

In some embodiments, a circuit includes a first inverter and a second inverter. The first inverter is coupled to an input terminal. The input terminal receives an input signal varying in a first voltage domain from a negative supply level to a first positive supply level. The second inverter is coupled between the first inverter and an output terminal. The second inverter generates an output signal varying in a second voltage domain from the negative supply level to a second positive supply level. The first inverter includes a first PMOS transistor and a first NMOS transistor. The first PMOS transistor is biased by a first input tracking signal generated from the input signal. The first input tracking signal varies in a third voltage domain from a reference level to the first positive supply level. The reference level is higher than the negative supply level. The first NMOS transistor is biased by a second input tracking signal generated from the input signal. The second input tracking signal varies in the second voltage domain.

In some embodiments, a first voltage difference window of the first voltage domain is larger than a second voltage difference window of the second voltage domain. The first voltage difference window is larger than a third voltage difference window of the third voltage domain. In some embodiments, the second voltage difference window is substantially equal to the third voltage difference window.

In some embodiments, the first inverter further includes a second PMOS transistor, a third PMOS transistor and a second NMOS transistor. A source terminal of the second PMOS transistor is coupled to the first positive supply level. A gate terminal of the second PMOS transistor is biased by the reference level. A drain terminal of the second PMOS transistor is coupled to a source terminal of the first PMOS transistor. A source terminal of the third PMOS transistor is coupled to a drain terminal of the first PMOS transistor. A gate terminal of the third PMOS transistor is biased by the reference level. A drain terminal of the third PMOS transistor is coupled to a first node. A drain terminal of the second NMOS transistor is coupled to the first node. A gate terminal of the second NMOS transistor is biased by the second positive supply level. A source terminal of the second NMOS transistor is coupled to a drain terminal of the first NMOS transistor. A source terminal of the first NMOS transistor is coupled to the negative supply level. The first inverter is configured to generate a first inverted signal varying in the first voltage domain on the first node.

In some embodiments, the circuit further includes a first tracking high circuit, a first tracking low circuit and a second tracking low circuit. The first tracking high circuit is coupled between the input terminal and a gate terminal of the first PMOS transistor. The first tracking high circuit is configured to convert the input signal into the first input tracking signal. The first tracking low circuit is coupled between the input terminal and a gate terminal of the first NMOS transistor. The first tracking low circuit is configured to convert the input signal into the second input tracking signal. The second tracking low circuit is coupled between the first node and the second inverter. The second tracking low circuit is configured to convert the first inverted signal into a second inverted signal varying in the second voltage domain. The second inverter is configured to invert the second inverted signal into the output signal.

In some embodiments, the first tracking high circuit includes a fourth PMOS transistor and a fifth PMOS transistor. A source terminal of the fourth PMOS transistor is coupled to the gate terminal of the first PMOS transistor. A gate terminal of the fourth PMOS transistor is coupled to the input terminal. A drain terminal of the fourth PMOS transistor is coupled to the reference level. A source terminal of the fifth PMOS transistor is coupled to the gate terminal of the first PMOS transistor. A gate terminal of the fifth PMOS transistor is coupled to the reference level. A drain terminal of the fifth PMOS transistor is coupled to the input terminal. The first tracking low circuit includes a third NMOS transistor and a fourth NMOS transistor. A source terminal of the third NMOS transistor is coupled to the second positive supply level. A gate terminal of the third NMOS transistor is coupled to the input terminal. A drain terminal of the third NMOS transistor is coupled to the gate terminal of the first NMOS transistor. A source terminal of the fourth NMOS transistor is coupled to the gate terminal of the first NMOS transistor. A gate terminal of the fourth NMOS transistor is coupled to the second positive supply level. A drain terminal of the fourth NMOS transistor is coupled to the input terminal.

In some embodiments, the first tracking high circuit includes a fourth PMOS transistor and a first resistor. A source terminal of the fourth PMOS transistor is coupled to the gate terminal of the first PMOS transistor. A gate terminal of the fourth PMOS transistor is coupled to the input terminal. A drain terminal of the fourth PMOS transistor is coupled to the reference level. A first terminal of the first resistor is coupled to the first positive supply level. A second terminal of the first resistor is coupled to the gate terminal of the first PMOS transistor. The first tracking low circuit includes a third NMOS transistor and a second resistor. A source terminal of the third NMOS transistor is coupled to the gate terminal of the first NMOS transistor. A gate terminal of the third NMOS transistor is coupled to the input terminal. A drain terminal of the third NMOS transistor is coupled to the second positive supply level. A first terminal of the second resistor is coupled to the gate terminal of the first NMOS transistor. A second terminal of the second resistor is coupled to the negative supply level.

In some embodiments, the circuit includes a first feedback loop. The first feedback loop includes a fifth NMOS transistor and a sixth NMOS transistor. A drain terminal of the fifth NMOS transistor is coupled to the first node. A gate terminal of the fifth NMOS transistor is coupled to the second positive supply level. A drain terminal of the sixth NMOS transistor is coupled to a source terminal of the fifth NMOS transistor. A gate terminal of the sixth NMOS transistor is coupled to the output terminal. A source terminal of the sixth NMOS transistor is coupled to the negative supply level.

In some embodiments, the circuit further includes a third inverter, a second tracking high circuit and a second feedback loop. The second tracking high circuit is coupled between the first node and the third inverter. The second tracking low circuit is configured to convert the first inverted signal into a third inverted signal varying in the third voltage domain. The second feedback loop includes a sixth PMOS transistor and a seventh PMOS transistor. A source terminal of the sixth PMOS transistor is coupled to the first positive supply level. A gate terminal of the sixth PMOS transistor is coupled to the third inverter. A source terminal of the seventh PMOS transistor is coupled to a drain terminal of the sixth PMOS transistor. A gate terminal of the seventh PMOS transistor is coupled to the reference level. A drain terminal of the seventh PMOS transistor is coupled to the first node.

In some embodiments, the circuit further includes an eighth PMOS transistor and a seventh NMOS transistor. A source terminal of the eighth PMOS transistor is coupled to the first positive supply level. A gate terminal of the eighth PMOS transistor is coupled to a first enable signal in the third voltage domain. A drain terminal of the eighth PMOS transistor is coupled to the source terminal of the third PMOS transistor. A source terminal of the seventh NMOS transistor is coupled to the negative supply level. A gate terminal of the seventh NMOS transistor is coupled to a second enable signal in the second voltage domain. A drain terminal of the seventh NMOS transistor is coupled to the source terminal of the first NMOS transistor.

In some embodiments, the reference level is substantially equal to the first positive supply level minus the second positive supply level.

In some embodiments, a circuit includes a first PMOS transistor, a second PMOS transistor, a third PMOS transistor, a first NMOS transistor and a second NMOS transistor. The first PMOS transistor is biased by a first input tracking signal generated from the input signal. The input signal varies in a first voltage domain from a negative supply level to a first positive supply level. The first input tracking signal varies in a third voltage domain from a reference level to the first positive supply level. The reference level is higher than the negative supply level. A source terminal of the second PMOS transistor is coupled to the first positive supply level. A gate terminal of the second PMOS transistor being biased by the reference level. A drain terminal of the second PMOS transistor being coupled to a source terminal of the first PMOS transistor. A source terminal of the third PMOS transistor being coupled to a drain terminal of the first PMOS transistor. A gate terminal of the third PMOS transistor is biased by the reference level. A drain terminal of the third PMOS transistor is coupled to a first node. The first NMOS transistor is biased by a second input tracking signal generated from the input signal. The second input tracking signal varies in a second voltage domain from the negative supply level to a second positive supply level. A source terminal of the first NMOS transistor is coupled to the negative supply level. A drain terminal of the second NMOS transistor is coupled to the first node. A gate terminal of the second NMOS transistor is biased by the second positive supply level. A source terminal of the second NMOS transistor is coupled to a drain terminal of the first NMOS transistor. A first inverted signal varying in the first voltage domain is generated on the first node.

In some embodiments, a first voltage difference window of the first voltage domain is larger than a second voltage difference window of the second voltage domain. The first voltage difference window is larger than a third voltage difference window of the third voltage domain. In some embodiments, the second voltage difference window is substantially equal to the third voltage difference window.

In some embodiments, the circuit further includes a first tracking high circuit and a first tracking low circuit. The first tracking high circuit is coupled between the input terminal and a gate terminal of the first PMOS transistor. The first tracking high circuit is configured to convert the input signal into the first input tracking signal. The first tracking low circuit is coupled between the input terminal and a gate terminal of the first NMOS transistor. The first tracking low circuit is configured to convert the input signal into the second input tracking signal.

In some embodiments, the circuit further includes a second tracking low circuit coupled with the first node. The second tracking low circuit is configured to convert the first inverted signal into a second inverted signal varying in the second voltage domain. In some embodiments, the circuit further includes an inverter coupled between the second tracking low circuit and an output terminal. The inverter generates an output signal varying in the second voltage domain according to the second inverted signal.

In some embodiments, a method includes steps of: based on an input signal varying in a first voltage domain from a negative supply level to a first positive supply level, generating a first input tracking signal varying in a third voltage domain from a reference level to the first positive supply level; based on the input signal, generating a second input tracking signal varying in a second voltage domain from a reference level to the first positive supply level; biasing a pull-up transistor with the first input tracking signal; and, biasing a pull-low transistor with the second input tracking signal.

In some embodiments, a first voltage difference window of the first voltage domain is larger than a second voltage difference window of the second voltage domain, and the first voltage difference window is larger than a third voltage difference window of the third voltage domain. In some embodiments, the second voltage difference window is substantially equal to the third voltage difference window.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first inverter, coupled to an input terminal, the input terminal receiving an input signal varying in a first voltage domain from a negative supply level to a first positive supply level;
   a second inverter, coupled between the first inverter and an output terminal, the second inverter generating an output signal varying in a second voltage domain from the negative supply level to a second positive supply level,
   wherein the first inverter comprises:
   a first PMOS transistor coupled to the second inverter and configured to be biased by a first input tracking signal that is associated with the input signal, wherein the first input tracking signal varies in a third voltage domain from a reference level to the first positive supply level, and the reference level is higher than the negative supply level;
   a first NMOS transistor coupled to the second inverter and configured to be biased by a second input tracking signal that is associated with the input signal, wherein the second input tracking signal varies in the second voltage domain; and
   a second PMOS transistor configured to be biased by the reference level that is independent from the first input tracking signal, wherein a source terminal of the second PMOS transistor is coupled to the first positive supply level, and a drain terminal of the second PMOS transistor is coupled to a source terminal of the first PMOS transistor; and
   a first feedback loop coupled between an output of the first inverter and an output of the second inverter, and configured to receive and operate in response to the output signal from the second inverter.

2. The circuit of claim 1, wherein a first voltage difference between a first voltage level and a second voltage level of the first voltage domain is larger than a second voltage difference between a third voltage level and a fourth voltage level of the second voltage domain, and the first voltage difference is larger than a third voltage difference between a fifth voltage level and a sixth voltage level of the third voltage domain.

3. The circuit of claim 2, the second voltage difference is substantially equal to the third voltage difference.

4. The circuit of claim 1, wherein the first inverter further comprises:
   a third PMOS transistor, wherein a source terminal of the third PMOS transistor is coupled to a drain terminal of the first PMOS transistor, a gate terminal of the third PMOS transistor is biased by the reference level, and a drain terminal of the third PMOS transistor is coupled to a first node; and
   a second NMOS transistor, wherein a drain terminal of the second NMOS transistor is coupled to the first node, a gate terminal of the second NMOS transistor is biased by the second positive supply level, and a source terminal of the second NMOS transistor is coupled to a drain terminal of the first NMOS transistor,
   wherein a source terminal of the first NMOS transistor is coupled to the negative supply level, and the first inverter is configured to generate a first inverted signal varying in the first voltage domain on the first node.

5. The circuit of claim 4, further comprising:
   a first tracking high circuit, coupled between the input terminal and a gate terminal of the first PMOS transistor, the first tracking high circuit being configured to convert the input signal into the first input tracking signal;
   a first tracking low circuit, coupled between the input terminal and a gate terminal of the first NMOS transistor, the first tracking low circuit being configured to convert the input signal into the second input tracking signal; and
   a second tracking low circuit, coupled between the first node and the second inverter, the second tracking low circuit being configured to convert the first inverted signal into a second inverted signal varying in the second voltage domain,
   wherein the second inverter is configured to invert the second inverted signal into the output signal.

6. The circuit of claim 5, wherein the first tracking high circuit comprises:
　a fourth PMOS transistor, wherein a source terminal of the fourth PMOS transistor is coupled to the gate terminal of the first PMOS transistor, a gate terminal of the fourth PMOS transistor is coupled to the input terminal, and a drain terminal of the fourth PMOS transistor is coupled to the reference level; and
　a fifth PMOS transistor, wherein a source terminal of the fifth PMOS transistor is coupled to the gate terminal of the first PMOS transistor, a gate terminal of the fifth PMOS transistor is coupled to the reference level, and a drain terminal of the fifth PMOS transistor is coupled to the input terminal, and the first tracking low circuit comprises:
　a third NMOS transistor, wherein a source terminal of the third NMOS transistor is coupled to the second positive supply level, a gate terminal of the third NMOS transistor is coupled to the input terminal, and a drain terminal of the third NMOS transistor is coupled to the gate terminal of the first NMOS transistor; and
　a fourth NMOS transistor, wherein a source terminal of the fourth NMOS transistor is coupled to the gate terminal of the first NMOS transistor, a gate terminal of the fourth NMOS transistor is coupled to the second positive supply level, and a drain terminal of the fourth NMOS transistor is coupled to the input terminal.

7. The circuit of claim 5, wherein
the first tracking high circuit comprises:
　a fourth PMOS transistor, wherein a source terminal of the fourth PMOS transistor is coupled to the gate terminal of the first PMOS transistor, a gate terminal of the fourth PMOS transistor is coupled to the input terminal, and a drain terminal of the fourth PMOS transistor is coupled to the reference level; and
　a first resistor, wherein a first terminal of the first resistor is coupled to the first positive supply level, and a second terminal of the first resistor is coupled to the gate terminal of the first PMOS transistor, and
the first tracking low circuit comprises:
　a third NMOS transistor, wherein a source terminal of the third NMOS transistor is coupled to the gate terminal of the first NMOS transistor, a gate terminal of the third NMOS transistor is coupled to the input terminal, and a drain terminal of the third NMOS transistor is coupled to the second positive supply level; and
　a second resistor, wherein a first terminal of the second resistor is coupled to the gate terminal of the first NMOS transistor, and a second terminal of the second resistor is coupled to the negative supply level.

8. The circuit of claim 5, wherein the first feedback loop comprises:
　a fifth NMOS transistor, wherein a drain terminal of the fifth NMOS transistor is coupled to the first node, and a gate terminal of the fifth NMOS transistor is coupled to the second positive supply level; and
　a sixth NMOS transistor, wherein a drain terminal of the sixth NMOS transistor is coupled to a source terminal of the fifth NMOS transistor, a gate terminal of the sixth NMOS transistor is coupled to the output terminal, and a source terminal of the sixth NMOS transistor is coupled to the negative supply level.

9. The circuit of claim 8, further comprising:
a third inverter;
　a second tracking high circuit, coupled between the first node and the third inverter, the second tracking high circuit being configured to convert the first inverted signal into a third inverted signal varying in the third voltage domain; and
　a second feedback loop, wherein the second feedback loop comprises:
　a sixth PMOS transistor, wherein a source terminal of the sixth PMOS transistor is coupled to the first positive supply level, and a gate terminal of the sixth PMOS transistor is coupled to the third inverter; and
　a seventh PMOS transistor, wherein a source terminal of the seventh PMOS transistor is coupled to a drain terminal of the sixth PMOS transistor, a gate terminal of the seventh PMOS transistor is coupled to the reference level, and a drain terminal of the seventh PMOS transistor is coupled to the first node.

10. The circuit of claim 9, further comprising:
an eighth PMOS transistor, wherein a source terminal of the eighth PMOS transistor is coupled to the first positive supply level, a gate terminal of the eighth PMOS transistor is coupled to a first enable signal in the third voltage domain, and a drain terminal of the eighth PMOS transistor is coupled to the source terminal of the third PMOS transistor; and
a seventh NMOS transistor, wherein a source terminal of the seventh NMOS transistor is coupled to the negative supply level, a gate terminal of the seventh NMOS transistor is coupled to a second enable signal in the second voltage domain, and a drain terminal of the seventh NMOS transistor is coupled to the source terminal of the first NMOS transistor.

11. The circuit of claim 1, wherein the reference level is substantially equal to the first positive supply level minus the second positive supply level.

12. A circuit, comprising:
　a first PMOS transistor biased by a first input tracking signal that is associated with an input signal, the input signal varying in a first voltage domain from a negative supply level to a first positive supply level, the first input tracking signal varying in a third voltage domain from a reference level to the first positive supply level, wherein the reference level is higher than the negative supply level;
　a second PMOS transistor, a source terminal of the second PMOS transistor being coupled to the first positive supply level, a gate terminal of the second PMOS transistor being biased by the reference level and disconnected from a gate terminal of the first PMOS transistor, a drain terminal of the second PMOS transistor being coupled to a source terminal of the first PMOS transistor;
　a third PMOS transistor, a source terminal of the third PMOS transistor being coupled to a drain terminal of the first PMOS transistor, a gate terminal of the third PMOS transistor being biased by the reference level, a drain terminal of the third PMOS transistor being coupled to a first node;
　a first NMOS transistor biased by a second input tracking signal that is associated with the input signal, the second input tracking signal varying in a second voltage domain from the negative supply level to a second positive supply level, a source terminal of the first NMOS transistor being coupled to the negative supply level;
　a second NMOS transistor, a drain terminal of the second NMOS transistor being coupled to the first node, a gate terminal of the second NMOS transistor being biased by the second positive supply level, a source terminal of the second NMOS transistor being coupled to a drain terminal of the first NMOS transistor; and a first tracking high circuit, coupled between an input terminal that receives the input signal and the gate terminal of the first PMOS transistor, wherein the first tracking high circuit is configured to convert the input signal into the first input tracking signal and comprises a resistor, wherein a first terminal of the resistor is coupled to the first positive supply level, and a second terminal of the resistor is coupled to the gate terminal of the first PMOS transistor, wherein a first inverted signal varying in the first voltage domain is generated on the first node.

13. The circuit of claim 12, wherein a first voltage difference between a first voltage level and a second voltage level of the first voltage domain is larger than a second voltage difference between a third voltage level and a fourth voltage level of the second voltage domain, and the first voltage difference is larger than a third voltage difference between a fifth voltage level and a sixth voltage level of the third voltage domain.

14. The circuit of claim 13, the second voltage difference is substantially equal to the third voltage difference.

15. The circuit of claim 12, further comprises:
a first tracking low circuit, coupled between the input terminal and a gate terminal of the first NMOS transistor, the first tracking low circuit being configured to convert the input signal into the second input tracking signal.

16. The circuit of claim 12, further comprises:
a second tracking low circuit, coupled with the first node, the second tracking low circuit being configured to convert the first inverted signal into a second inverted signal varying in the second voltage domain.

17. The circuit of claim 16, further comprises:
an inverter, coupled between the second tracking low circuit and an output terminal, the inverter generating an output signal varying in the second voltage domain according to the second inverted signal.

18. A method, comprising:
based on an input signal varying in a first voltage domain from a negative supply level to a first positive supply level, generating a first input tracking signal varying in a third voltage domain from a reference level to the first positive supply level;

based on the input signal, generating a second input tracking signal varying in a second voltage domain from the negative supply level to a second positive supply level;

biasing a first pull-up transistor of a first inverter, with the first input tracking signal;

biasing a pull-low transistor of the first inverter, with the second input tracking signal;

biasing a second pull-up transistor of the first inverter, with the reference level that is independent from the first input tracking signal, wherein a first terminal of the second pull-up transistor is coupled to the first positive supply level, and a second terminal of the second pull-up transistor is coupled to a terminal of the first pull-up transistor;

generating, by a second inverter, an output signal, based on an output of the first inverter; and a first feedback loop receiving the output signal from the second inverter and operating in response to the output signal from the second inverter.

19. The method of claim 18, wherein a first voltage difference between a first voltage level and a second voltage level of the first voltage domain is larger than a second voltage difference between a third voltage level and a fourth voltage level of the second voltage domain, and the first voltage difference is larger than a third voltage difference between a fifth voltage level and a sixth voltage level of the third voltage domain.

20. The method of claim 19, wherein the second voltage difference is substantially equal to the third voltage difference.

* * * * *